US011269017B2

(12) United States Patent
Fontaine et al.

(10) Patent No.: US 11,269,017 B2
(45) Date of Patent: Mar. 8, 2022

(54) DIAGNOSTIC FOR PULSED SOLENOID I/P FUNCTIONALITY

(71) Applicant: FISHER CONTROLS INTERNATIONAL LLC, Marshalltown, IA (US)

(72) Inventors: Michael R. Fontaine, Marshalltown, IA (US); Davin S. Nicholas, Bondurant, IA (US); Gregory R. Bulleit, Marshalltown, IA (US); Christopher C. Arnold, Grinell, IA (US); David L. Smid, Marshalltown, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 84 days.

(21) Appl. No.: 16/778,814

(22) Filed: Jan. 31, 2020

(65) Prior Publication Data
US 2021/0239768 A1    Aug. 5, 2021

(51) Int. Cl.
| | |
|---|---|
| *G01R 31/50* | (2020.01) |
| *F16K 37/00* | (2006.01) |
| *F16K 31/06* | (2006.01) |

(52) U.S. Cl.
CPC .......... *G01R 31/50* (2020.01); *F16K 37/0041* (2013.01); *F16K 31/06* (2013.01)

(58) Field of Classification Search
CPC ......... G01R 31/50; G01R 31/56; F16K 37/00; F16K 37/0025; F16K 37/0041; F16K 31/06; G05B 9/02

USPC .......................................... 324/546; 361/160
See application file for complete search history.

(56) References Cited

U.S. PATENT DOCUMENTS

| | | | | |
|---|---|---|---|---|
| 4,873,606 | A * | 10/1989 | Pannier | G05B 9/02 |
| | | | | 361/152 |
| 7,405,917 | B2 * | 7/2008 | Ahrens | F16K 31/06 |
| | | | | 361/152 |
| 10,422,438 | B2 | 9/2019 | Fontaine | |
| 2015/0167861 | A1 * | 6/2015 | Ferrer Herrera | A01G 25/16 |
| | | | | 239/73 |
| 2020/0072893 | A1 * | 3/2020 | Madane | F15B 13/0442 |

\* cited by examiner

*Primary Examiner* — Christopher E Mahoney
(74) *Attorney, Agent, or Firm* — Marshall, Gerstein & Borun LLP

(57) ABSTRACT

Techniques for diagnosing failures in a digital solenoid I/P converter are provided herein. A controller of the I/P converter may apply a fixed voltage to the I/P converter, causing an armature to move from an off-position to an on-position in a properly-functioning I/P converter. The controller may receive an indication of whether a digital logic line trip has occurred, indicating that a current for the I/P coil has reached a desired maximum current level, and an elapsed time from the application of the fixed voltage. The controller may compare the amount of time elapsed from the application of the fixed voltage to an expected amount of elapsed time from the application of the fixed voltage to the I/P coil after which a digital logic line trip will occur for a properly functioning I/P coil and diagnose, based on the comparison, a failure in the I/P converter.

14 Claims, 9 Drawing Sheets

DIAGNOSTIC FOR PULSED SOLENOID I/P FUNCTIONALITY

FIELD OF THE DISCLOSURE

The present disclosure relates generally to converters and, more particularly, to electro-pneumatic converters and related methods.

BACKGROUND

Control valves (e.g., sliding stem valves, rotary valves, axial flow valves, globe valves, etc.) are commonly used in industrial processes, such as oil and gas pipeline distribution systems and chemical processing plants, to control the flow of process fluids. These control valves are automated using a pressure-operated actuator that is controlled by a remote-operated field instrument. The field instrument communicates with a process control computer to command fluid flow changes within the valve to achieve a desired control strategy via pressure-operated actuators. Electro-pneumatic (I/P) converters, such as current-to-pressure transducers, are commonly used in field instruments to provide a conversion of an electrical signal to a volumetric flow or pressure output (i.e., a pneumatic pressure signal) to control the actuator and, thus, the control valve.

An example electro-pneumatic converter (e.g., as discussed in U.S. Pat. No. 10,422,438 B2, which is hereby incorporated by reference in its entirety) may be fluidly coupled between a supply pressure source that supplies pressurized fluid and a downstream device, such as a pneumatic relay, that uses the pressurized fluid to control a process control device (e.g., an actuator). The example electro-pneumatic converter may control the flow of the pressurized fluid between the supply pressure source and the downstream device. In particular, the example electro-pneumatic converter may operate between a closed state (sometimes referred to as off or unlatched) and an open state (sometimes referred to as on or latched). In the closed state, no pressurized fluid is provided to the downstream device. In the open state, an electrical signal in the form of a current is applied to the electro-pneumatic converter, which allows the flow of pressurized fluid to the downstream device and, thus, converts an electrical input signal into a pneumatic pressure signal.

Electro-pneumatic converters may utilize a solenoid having a coil and a movable armature to control the flow of pressurized fluid between a supply port and one or more output port(s). In some examples, the electro-pneumatic converter includes an axial passageway between the supply port and an exhaust port. The one or more output ports are fluidly coupled to the axial passageway and may be coupled to a downstream device, such as a pneumatic relay. The supply port is to receive pressurized fluid from the pressure supply source. The armature is disposed in and movable in the axial passageway between a first position blocking the pressurized fluid from flowing through the axial passageway between the supply port and the output port(s) and a second position allowing the pressurized fluid to flow through the axial passageway between the supply port and the output port(s). When the solenoid is activated, the armature moves from the first position to the second position to allow the pressurized fluid to flow to the output port(s). In the first position, when the supply port is blocked, the exhaust port is unblocked and the output ports(s) are fluidly coupled to the exhaust port (e.g., vented to atmosphere). In the second position, when the supply port is unblocked, the armature blocks the exhaust port, thereby enabling the pressurized fluid to flow from the supply port to the output port(s). The solenoid can be activated and deactivated to move the armature back-and-forth in the passageway between the first and second positions to control the flow of pressurized fluid to the output port(s). This geometry enables the armature to travel a relatively small distance between the first (closed) and second (open) positions.

In particular, a digital solenoid I/P converter typically includes an armature that is initially biased by a spring to an off-position, with no voltage applied. To actuate the armature, a fixed voltage is applied until a desired maximum current level is reached. Once the maximum current level is reached, a reduced voltage is applied to hold the armature in the pulled-in position (i.e., the on-position). When the voltage is removed (or, in some examples, when a small negative voltage is applied), the spring force returns the armature to the off-position.

It is desirable to detect instances in which digital solenoid I/P converter coil and drive circuitry are properly functioning as well as instances in which the digital solenoid I/P converter coil or drive circuitry fails. When the digital solenoid I/P converter coil or drive circuitry fails, it is desirable to diagnose why the failure occurred so that any issues with the digital solenoid I/P converter coil or drive circuitry can be corrected.

SUMMARY

In an aspect, a method for diagnosing failures in a digital solenoid I/P converter in a process control system is provided, wherein the digital solenoid I/P converter includes an I/P coil and drive circuitry, and wherein the digital solenoid I/P converter, when actuated, causes an armature to move from an off-position to an on-position, the method comprising: establishing that a fixed voltage has been applied to the I/P coil at a first time; receiving, from a current sensor, an indication of a current level associated with the I/P coil; performing a first comparison of the indication of the current level associated with the I/P coil and a desired maximum current level; causing, based on the comparison, a digital logic line to trip when the current level associated with the I/P coil reaches the desired maximum current level; receiving, from a timer, an indication of an amount of time that has elapsed from the first time to a second time, the second time being a time associated with the digital logic line trip; performing a second comparison of (i) the amount of time elapsed from the first time to the second time and (ii) an expected amount of elapsed time from the application of the fixed voltage to the I/P coil after which the digital logic line will trip for a properly functioning I/P coil and drive circuitry; determining, based on the second comparison, whether the I/P coil and drive circuitry are properly functioning or whether one or more of the I/P coil or the drive circuitry has failed; and causing a controller to take a control action changing the operation of the process control system based on determining that one or more of the I/P coil or the drive circuitry has failed.

In another aspect, a system for diagnosing failures in a digital solenoid I/P converter in a process control system is provided, the system comprising: a digital solenoid I/P converter, including an I/P coil and drive circuitry, the digital solenoid I/P converter being configured to cause an armature to move from an off-position to an on-position when actuated; a controller configured to cause a fixed voltage to be applied to the I/P coil at a first time; a current sensor configured to sense an amount of current associated with the I/P coil; a timer configured to determine an amount of time elapsed from the first time; and the diagnostic circuit configured to: perform a first comparison of the sensed amount of current associated with the I/P coil and a maximum desired current level; cause, based on the first comparison, a digital logic line to trip when the sensed amount of current associated with the I/P coil reaches the maximum desired current level; receive, from the timer, an indication of an amount of time that has elapsed from the first time to a second time associated with the tripping of the digital logic line; perform a second comparison of the (i) the amount of time elapsed from first time to the second time to (ii) an expected amount of elapsed time from the application of the fixed voltage to the I/P coil after which a digital logic line trip will occur for a properly functioning I/P coil and drive circuitry; and determine, based on the second comparison, whether the I/P coil and drive circuitry are properly functioning or whether one or more of the I/P coil or the drive circuitry has failed.

DETAILED DESCRIPTION

Figure 1:
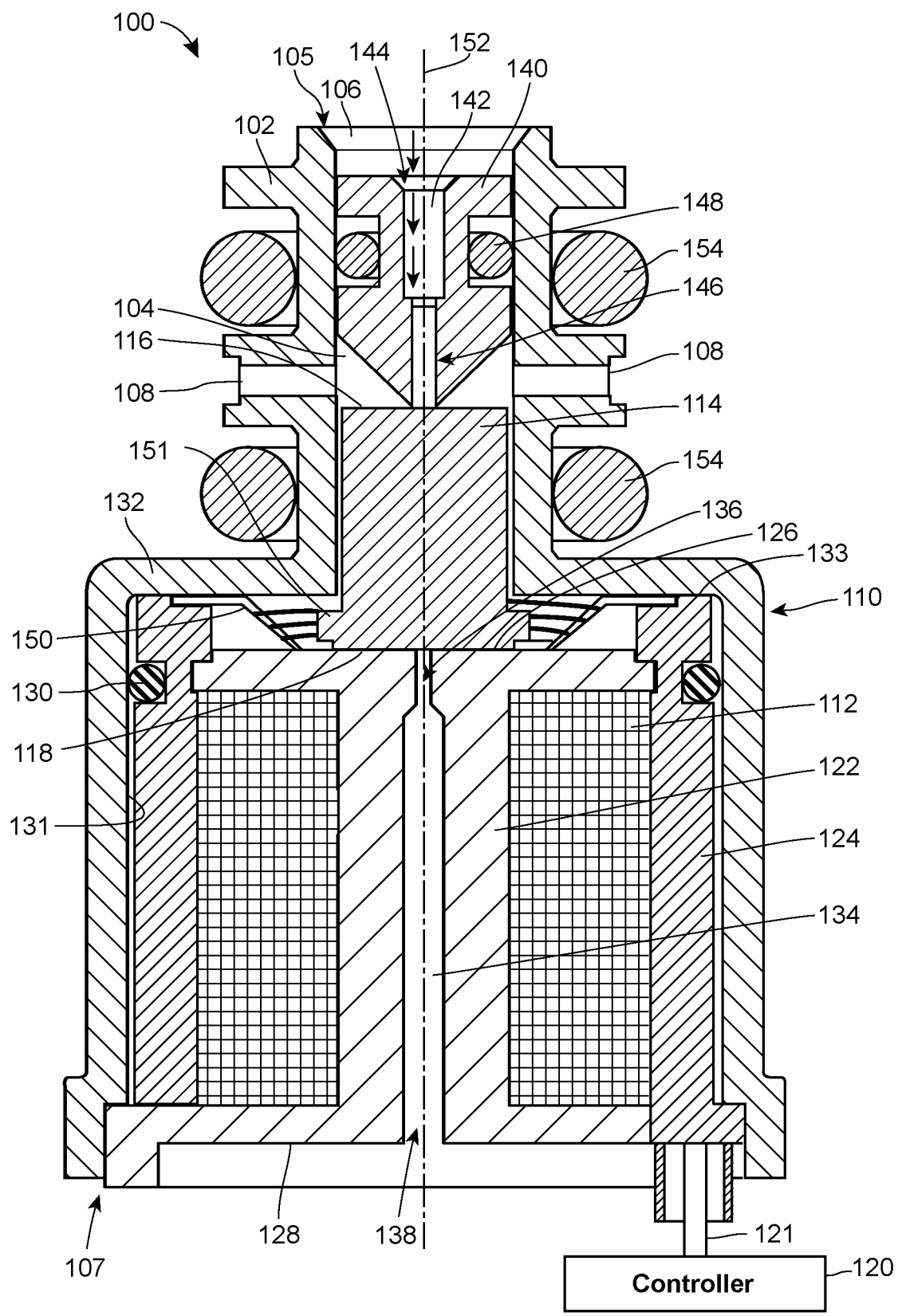
FIG. 1 is a cross-sectional view of an example electro-pneumatic converter having an example armature in a first (closed) position.

As discussed above, a digital solenoid I/P converter typically includes an armature that is initially biased by a spring to an off-position, with no voltage applied. To actuate the armature, a fixed voltage is applied until a desired maximum current level is reached. Once the maximum current level is reached, a reduced voltage is applied to hold the armature in the pulled-in position (i.e., the on-position). When the voltage is removed (or, in some examples, when a small negative voltage is applied), the spring force returns the armature to the off-position.

The present disclosure provides techniques for detecting instances in which a digital solenoid I/P converter coil and drive circuitry are properly functioning as well as instances in which the digital solenoid I/P converter coil and/or drive circuitry fail. Furthermore, the present disclosure provides techniques diagnosing possible causes for digital solenoid I/P converter coil or drive circuitry failures, i.e., so that any issues with the digital solenoid I/P converter coil or drive circuitry can be corrected.

Using the present techniques, a digital logic line is toggled or tripped when the desired maximum current has been reached, and resets when the I/P converter armature "unlatch" command is sent. The amount of time that elapses between the initial application of the voltage and the toggling of the digital logic line can be used to determine if the I/P converter is properly functioning, or if the I/P converter is malfunctioning in some way (e.g., whether there is an open circuit in the coil, the coil is short-circuited, the armature has not moved, etc.).

For example, using a 650 ohm coil, a 7 V drive rail, and a 5 mA maximum current, approximately 8 ms will elapse from the beginning of actuation until the 5 mA maximum current is reached for a properly functioning I/P converter. In contrast, when there is an open circuit in the coil or in the drive circuitry, the logic line will never be tripped because the current is never generated. Furthermore, using a shorted coil, a 7 V drive rail, and a 5 mA maximum current, when the coil is short-circuited, the current will rise very quickly because the resistance of the coil is eliminated. Consequently, when the coil is short-circuited, only approximately 0.1 ms will elapse from the beginning of actuation until the 5 mA current level is reached. Finally, when the armature is either already pulled in at the time of actuation or fails to pull in, the time to reach the 5 mA current level is reduced, as there is no dip in the current (because the armature does not move). Consequently, when the armature does not move, approximately 4 ms will elapse from the beginning of actuation until the 5 mA current level is reached.

Accordingly, the present techniques include diagnosing failures of the I/P converter coil and drive circuitry by determining whether the digital logic line has tripped, and, if so, further determining the amount of time that has elapsed from the initial application of voltage to the coil. For instance, when using a 650 ohm coil, a 7 V drive rail, and a 5 mA maximum current, as discussed above, the digital logic line tripping after about 8 ms will indicate that the I/P converter coil and drive circuitry are functioning properly, while the digital logic line tripping after about 5 ms will indicate that the armature has not moved, the digital logic line tripping after about 1 ms will indicate that the coil or drive circuitry is short-circuited, and the digital logic line not tripping at all will indicate that there is an open circuit in the coil or in the drive circuitry.

Turning now to the figures, FIG. 1 is a cross-sectional view of an example electro-pneumatic (I/P) converter 100 (referred to herein as the converter 100) constructed in accordance with one or more principles of this disclosure. The example converter 100 converts an electrical input signal into a pneumatic output signal (e.g., a pressure signal) by controlling the flow of pressurized fluid through the converter 100. In some examples, the pneumatic output signal is used to control a device, such as a pneumatic actuator for actuating a valve. In some examples, the pneumatic output signal is amplified via a pneumatic relay to a higher pressure and/or volumetric flow rate, which is then supplied to the actuator for actuating the valve.

The converter 100 includes a body 102 defining an axial passageway 104 extending between a first opening 105 and a second opening 107. The first opening 105 is defined by a supply port 106 that is to be fluidly coupled to a supply pressure source (e.g., plant air, process gas, etc.). Two output ports 108 are fluidly coupled to the passageway 104. The converter 100 operates to block or allow fluid flow between the supply port 106 and the output ports 108. The output ports 108 may be fluidly coupled to a downstream device that receives the pressurized fluid, which is considered a pneumatic output signal.

To control the flow of fluid between the supply port 106 and the output ports 108, the example converter 100 includes a solenoid 110 having a coil 112 and a movable armature 114 (e.g., a plug or plunger). The armature 114 is disposed in and movable within the passageway 104 between the first opening 105 and the second opening 107. The armature 114 has a first side 116 (e.g., a top side) that faces the supply port 106 and a second side 118 (e.g., a bottom side) that faces the solenoid 110. The armature 114 is movable between a first position (shown in FIG. 1, which may be referred to as an off position, a closed position or an unlatched position) in which the armature 114 blocks the flow of pressurized fluid through the passageway 104 between the supply port 106 and the output ports 108 and a second position (shown in FIG. 2, which may be referred to as an on position, an open position or a latched position) in which the armature 114 allows the flow of pressurized fluid through the passageway 104 between the supply port 106 and the output ports 108, as disclosed in further detail herein. A controller 120 is electrically coupled to the coil 112 via drive circuitry 121. The controller 120 may activate the solenoid 110 by applying a current to the coil 112 via the drive circuitry 121, as disclosed in further detail herein.

The solenoid 110 includes a core 122, around which the coil 112 is wrapped, and a sleeve 124. The core 122 and the coil 112 are disposed in the sleeve 124. The core 122 has a first side 126 (e.g., a top side) and a second side 128 (e.g., a bottom side) that form opposite sides of the solenoid 110. The solenoid 110 is disposed in the passageway 104 near the second opening 107. The solenoid 110 is disposed in a section of the passageway 104 having a larger diameter than the section of the passageway 104 near the first opening 105. In some examples, the solenoid 110 is press fit into the passageway 104 through the second opening 107. A seal 130 is disposed between the solenoid 110 and an inner wall 131 of the passageway 104. The seal 130 forms a fluid tight interface between the solenoid 110 and the body 102 and, thus, prevents the flow of fluid around the solenoid 110. A first side 133 of the sleeve 124 (e.g., a top side of the solenoid 110) is engaged with a wall 132 (e.g., a step) of the body 102 separating the smaller and larger sections of the passageway 104. In other examples, the first side 133 of the sleeve 124 may be separated from the wall 132. For example, the solenoid 110 may be formed with a ridge or lip that engages a corresponding lip formed on the inner wall 131 of the passageway (e.g., near the second opening 107), which may be advantageous during manufacturing and/or assembly. The core 122 of the solenoid 110 includes an exhaust passageway 134 between a first opening 136 (e.g., an exhaust port) in the first side 126 of the core 122 and a second opening 138 in the second side 128 of the core 122, disclosed in further detail herein.

A travel stop 140 is disposed in the passageway 104 near the supply port 106. The travel stop 140 has a travel stop passageway 142 between a first opening 144 and a second opening 146 in the travel stop 140. A seal 148 is disposed between the travel stop 140 and the inner wall 131 of the passageway 104 to prevent leakage by the travel stop 140. Thus, the flow of pressurized fluid into the passageway 104 is controlled through the travel stop passageway 142. The travel stop 140 may be adjusted to different locations in the passageway 104 to adjust the flow rate when the converter 100 is open or on, as discussed in further details herein. In some examples, the travel stop 140 is maintained in the passageway 104 via an interference fit. In other examples, travel stop 140 may be threaded into the passageway 104. In such an example, the travel stop 140 may be rotated in one direction or the other to adjust the location of the travel stop 140 in the passageway 104. As shown in FIG. 1, the side of the travel stop 140 facing the armature 114 is conical-shaped. However, in other examples, the side of the travel stop 140 may be shaped differently.

In the off or closed position illustrated in FIG. 1, the solenoid 110 is not energized and the armature 114 is biased toward the supply port 106 via a spring 150. The spring 150 is disposed between the armature 114 and the solenoid 110. An outer portion (e.g., an outer circumference) of the spring 150 is captured between the sleeve 124 (e.g., a notch in the first side 133 of the sleeve 124) and the wall 132 of the body 102. An inner portion (e.g., an inner circumference) of the spring 150 is coupled to the armature 114 at or near the second side 118 of the armature. The inner portion of the spring 150 is engaged with a flange 151 of the armature 114 near the second side 118 of the armature 114. The spring 150 biases the armature 114 toward the travel stop 140. In the example shown in FIG. 1, the spring 150 is a conical tension spring. However, in other examples, other types of springs may be implemented. Additionally, in other examples, the spring 150 may be disposed in other locations.

In the off or closed position illustrated in FIG. 1, the armature 114 blocks the flow of fluid from the supply port 106. More specifically, the armature 114 is engaged with the travel stop 140 and blocks the second opening 146, thereby blocking the flow of fluid through the travel stop passageway 142. As such, the armature 114 blocks the flow of pressurized fluid through the passageway 104 between the supply port 106 and the output ports 108. Further, in the off or closed position, the armature 114 is spaced apart from the first side 126 of the core 122 (e.g., the top side of the solenoid 110). In this position, the exhaust passageway 134 fluidly couples the passageway 104 to the atmosphere. As a result, a flow path is defined between the output ports 108 and exhaust passageway 134 (i.e., the output ports 108 are vented to atmosphere). Fluid may flow from the output ports 108, around the armature 114 (between the armature 114 and the inner wall 131 of the passageway 104), through the spring 150, between the second side 118 of the armature 114 and the first side 126 of the core 122, and through the exhaust passageway 134 to atmosphere. Therefore, any positive pressure at the output ports 108 (and/or a fluid line coupled to the output ports 108) is vented to atmosphere when the converter 100 is in the off or closed position.

Figure 2:
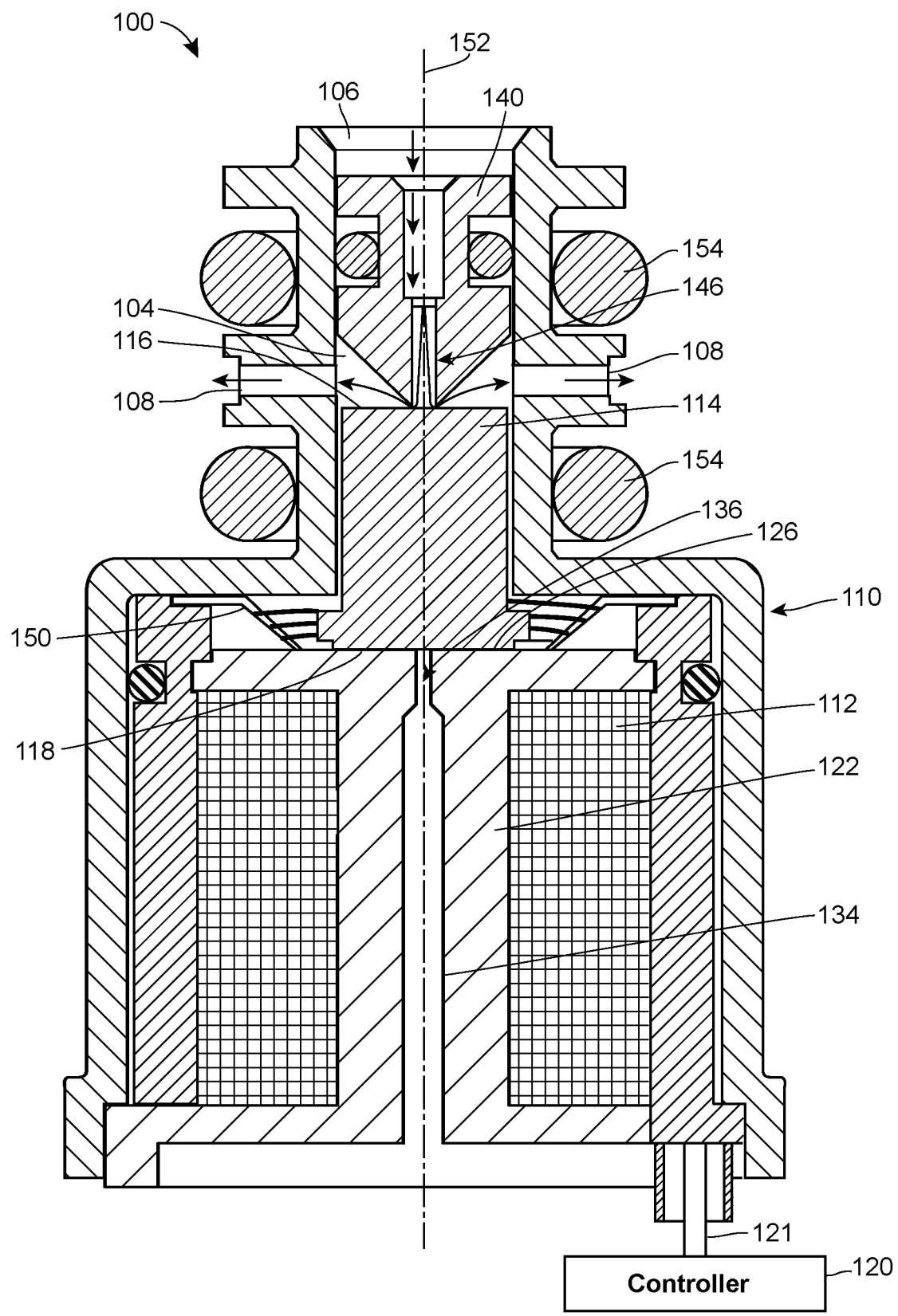
FIG. 2 is a cross-sectional view of the example electro-pneumatic converter of FIG. 1 with the example armature in a second (open) position.

To supply fluid from the supply port 106 to the output ports 108 (e.g., to generate a pneumatic output signal), the solenoid 110 may be turned on or activated by applying a current to the coil 112. FIG. 2 illustrates the example converter 100 when the solenoid 110 is activated. The core 122 may be constructed of a ferrous material (e.g., iron). The current in the coil 112 induces a magnetic field around the core 122. The armature 114, which is constructed of a metallic material (e.g., iron), is attracted to the core 122 and moves toward the first side 126 of the core 122. As a result, the armature 114 is moved away from the second opening 146 of the travel stop 140 and, thus, the pressurized fluid can flow through the passageway 104 from the supply port 106 to the output ports 108 (as shown by the arrows). Also, in the on or open position, the second side 118 of the armature 114 is engaged with the first side 126 of the core 122. In this position, the armature 114 closes the first opening 136 and, thus, blocks the exhaust passageway 134.

As illustrated in FIGS. 1 and 2, the armature 114 is movable along an axis 152 of the passageway 104 between the first position, blocking the supply port 106 (FIG. 1), and the second position, blocking the exhaust passageway 134 (FIG. 2). The supply port 106 and the exhaust passageway 134 are axially aligned with the passageway 104. This geometry enables the armature 114 to move a relatively small distance to control the flow of fluid through the converter 100. In particular, the armature 114 moves a relatively small distance between the first position (FIG. 1) and the second position (FIG. 2). In some examples, the armature 114 moves about 0.002 inches (in) (0.0508 millimeters (mm)). In other examples, the converter 100 may be designed such that armature 114 moves more or less in the passageway 104.

As shown in FIGS. 1 and 2, the output ports 108 extend from the passageway 104 in a direction that is perpendicular to the axis 152 of the passageway 104. In other examples, the output ports 108 may be oriented at a different angle relative to the axis 152. The converter 100 includes two output ports 108, which are disposed on opposite sides of the passageway 104. In other words, the output ports 108 extend from the passageway 104 in opposing directions. In some examples, by providing two opposing output flow paths, the fluid flowing through the travel stop 140 and past the armature 114 acts on the first side 116 (e.g., the top side) of the armature 114 in a symmetrical manner. In other words, the force acting on the first side 116 of the armature 114 from the flowing fluid is balanced. Otherwise, if only one output port is utilized, the fluid may bias the armature 114 to one side in the passageway 104, which, over time, may cause the armature 114 to become misaligned. In other examples, the converter 100 may include more (e.g., three, four, etc.) or fewer (e.g., one) output ports and the output port(s) may be disposed in other locations and/or oriented in other directions. In the example of FIGS. 1 and 2, the first side 116 of the armature 114 is relatively flat or planar. As a result, if the armature 114 is moved laterally in the passageway 104 (toward the inner wall 131), the first side 116 of the armature 114 may still block the second opening 146 of the travel stop 144 when the armature 114 is moved back to the first position. In other examples, the first side 116 of the armature may be shaped differently.

The flow rate of the converter 100 can be changed by adjusting the position of the travel stop 140 in the passageway 104. For instance, if the travel stop 140 is moved further into the passageway 104 toward the solenoid 110, less space is created between the travel stop 140 and the armature 114 when the armature 114 moves to the second position (FIG. 2). As a result, the flow rate is decreased. On the other hand, if the travel stop 140 is moved away from the solenoid 110 in the passageway 104, then more space is created between the travel stop 140 and the armature 114 when the armature 114 moves to the second position (FIG. 2). As a result, the flow rate is increased. Thus, the example converter 100 can be easily calibrated to achieve a desired flow rate (e.g., which may correspond to the pneumatic output signal) by adjusting the position of the travel stop 140.

Once the desired pressure at the output ports 108 is reached, the controller 120 may deactivate the solenoid 110 by ceasing the application of the current to the coil 112, which allows the armature 114 to move (e.g., via the spring 150) back to the first position (FIG. 1) and block the flow of fluid to the output ports 108. Further, the exhaust passageway 134 is opened. As a result, any pressure at the output ports 108 is vented to atmosphere through the exhaust passageway 134. In some examples, the controller 120 may apply a reverse current to the coil 112, which creates an electromagnetic field in the opposite direction that repels or pushes the armature 114 toward the travel stop 140. The converter 100 may be activated and deactivated relatively quickly (e.g., via pulses of current) to produce small pneumatic output signals (e.g., pulses of air) at the output ports 108.

In the off or closed position (FIG. 1), the armature 114 substantially blocks the flow of pressurized fluid into the passageway 104. In some instances, only a relatively small amount of fluid is leaked into the passageway 104. In some examples, the converter 100 achieves an air consumption of less than 0.1 square cubic feet per hour (SCFH) of air at 20 pounds-per-square-inch (PSI).

The converter 100 includes seals 154 (e.g., o-rings) disposed around the body 102 near the output ports 108. The seals 154 may be used to fluidly seal the converter 100 in a bore or passageway of a controller.

In some examples, the controller 120 initially applies a higher current to the coil 112 to move the armature 114 to the second position (FIG. 2) and then reduces the current to a lower current. Once the armature 114 is moved closer to the core 122, less magnetic force is needed to keep the armature 114 in the second position. Thus, less current is needed to generate a magnetic field sufficient to hold the armature 114 in place. Therefore, the controller 120 reduces the current once the armature 114 is moved to the second position and, thus, reduces the total power consumed by the converter 100.

Figure 3:
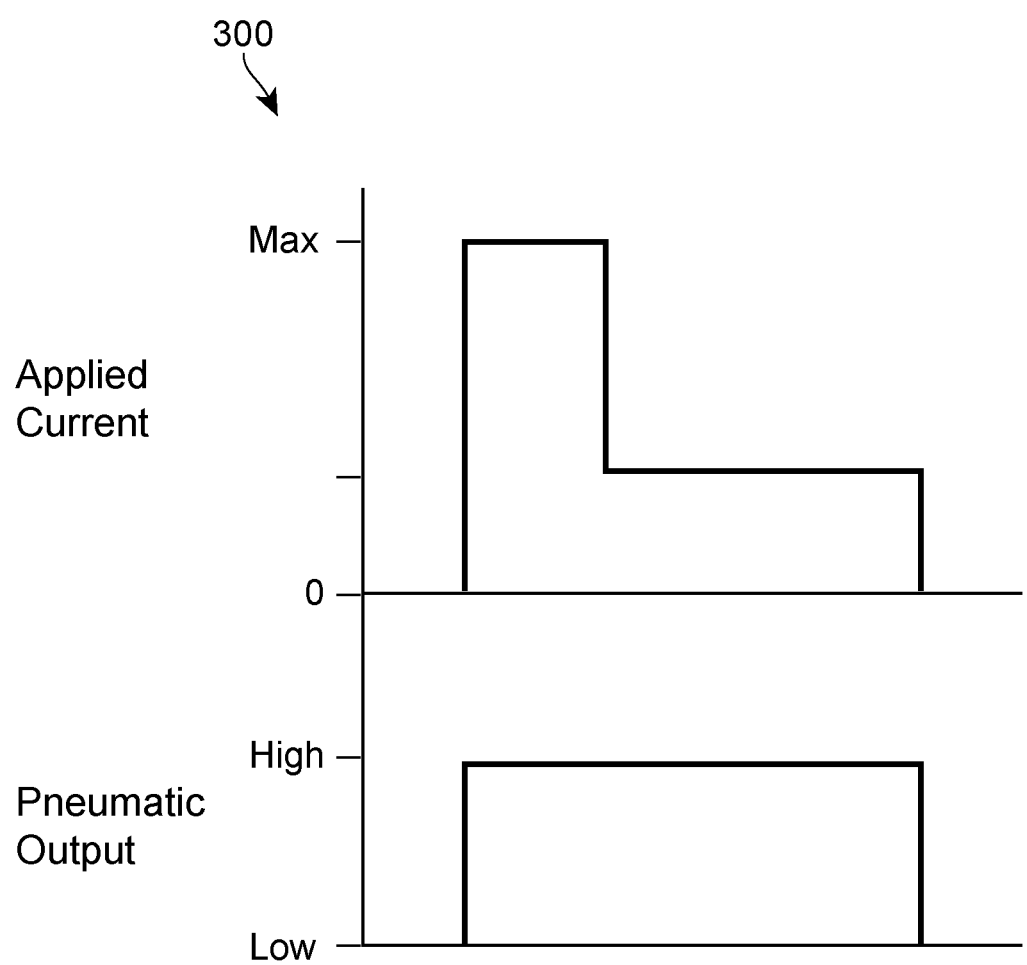
FIG. 3 is an example graph showing input current applied and output pressure achieved with the example electro-pneumatic converter of FIG. 1.

FIG. 3 illustrates an example graph 300 showing the applied current (top graph) and the corresponding pneumatic output (lower graph) produced by the example converter 100. As illustrated, when turning on the converter 100, the controller 120 applies a higher current to the coil 112 to move the armature 114 toward the solenoid 110 to overcome the bias of the spring 150. Once the armature 114 moves to the second position (FIG. 2), the flow path between the supply port 106 and the output ports 108 is opened, and a steady pneumatic output pressure is produced. Then, the applied current may be reduced. As mentioned above, once the armature 114 is near the core 122, the attractive force is stronger between the core 122 and the armature 114, so a lower magnetic field can be used to maintain the armature 114 in place. In some examples, the higher current is applied only for a period of time until the armature 114 is at or near the core 122, at which point the current can be reduced. By reducing the current, less energy is used to operate the example converter 100. In particular, even when the current is reduced, the output pressure remains constant. Thus, the example converter 100 is more energy efficient than known converters that apply the same high current throughout activation. In some examples, the high current signal is about 3 mA and the low current signal is about 1 mA. The current may then be ceased, which causes the converter 100 to close and cease producing a pneumatic output pressure. Therefore, the converter 100 operates between three power states (off, high current, and low current) to produce two pneumatic output states (on or off).

As shown in FIG. 2, when the armature 114 is in the second position, the second side 118 of the armature 114 is engaged with the first side 126 of the core. In this position, a pressure differential is formed that biases the armature 114 toward the solenoid 110 (into the second position). In particular, the pressure of the fluid in the passageway 104 acts on the first side 116 (e.g., the top side) and the lateral sides of the armature 114, thereby forcing the armature 114 toward the solenoid 110, and the pressure in the exhaust passageway 134 (e.g., atmospheric pressure) acts on a relatively small area on the second side 118 (e.g., the bottom side) of the armature 114, thereby forcing the armature 114 in the opposite direction. In some instances, if the spring 150 does not produce enough counter force on the armature 114 to overcome the pressure of the fluid in the passageway 104 acting on the armature 114, the armature 114 may remain stuck in the second position even after the solenoid 110 is deactivated. In other words, when the solenoid 110 deactivated and the armature 104 is in the second position (FIG. 2), the pressure of the fluid in the passageway 104 acting on the first side 116 and the lateral sides of the armature 104 may be greater than the combined force of the spring 150 and the pressure in the exhaust passageway 134 acting on the second side 118 of the armature. As a result, this pressure difference maintains the armature 114 in the second position against the bias of the spring 150. Therefore, in some examples, a relief pattern may be used to enable the higher pressure air in the passageway 104 to act on the second side 118 of the armature, such that the pressure acting on all of the sides of the armature 114 is substantially balanced. This enables a relatively smaller, lighter spring 150 to be used.

Figure 4:
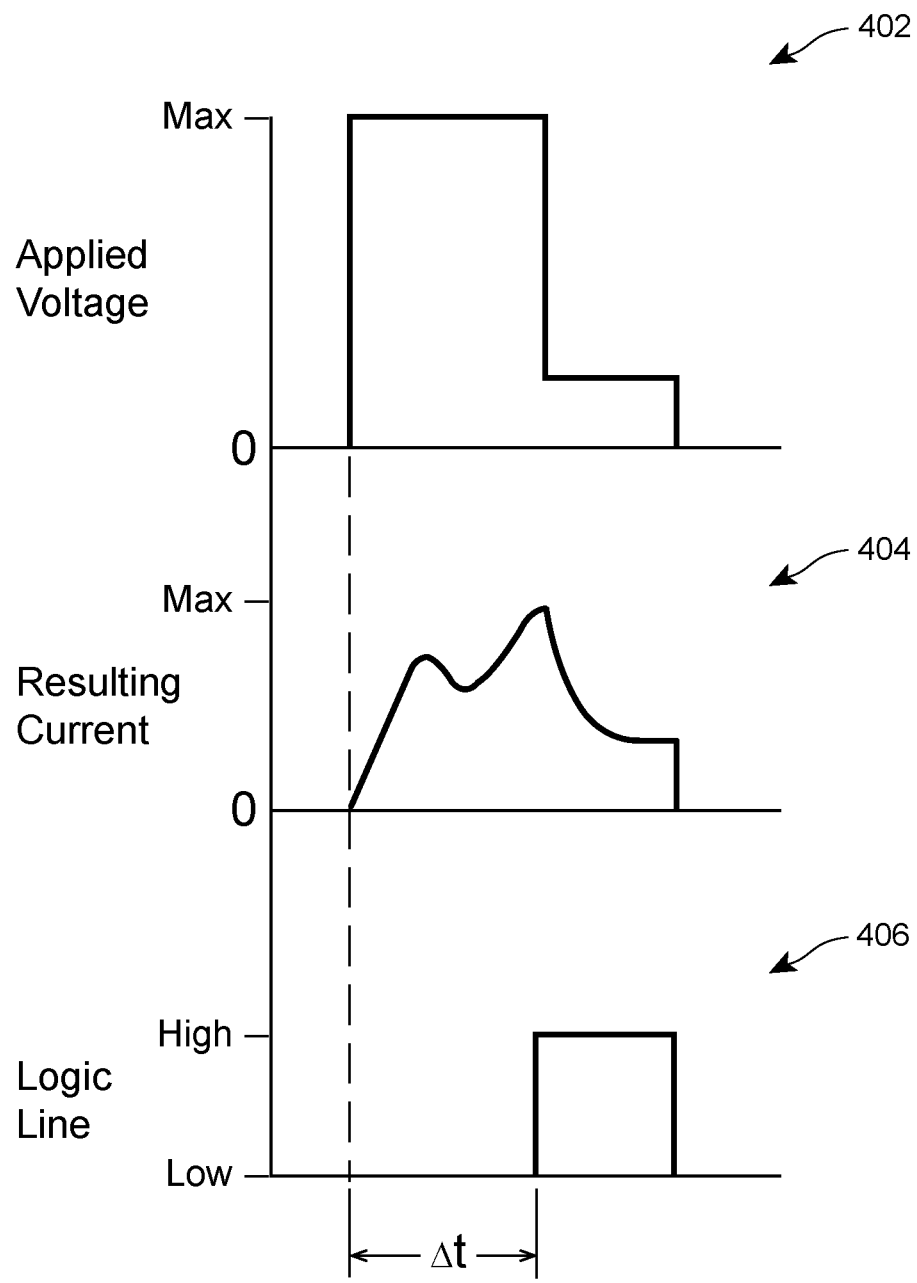
FIG. 4 includes several example graphs illustrating applied voltage over time, resulting current over time and logic line trips over time for an example properly functioning electro-pneumatic converter.

FIG. 4 illustrates example graphs 402, 404, and 406 illustrating applied voltage over time (402), resulting current over time (404) and logic line trips over time (406) for an example properly functioning I/P converter. For instance, graphs 402 and 404 illustrate that for an example properly functioning I/P converter, a fixed voltage is applied, as shown in graph 402, until a desired maximum current level is reached, as shown in graph 404. The dip in current shown in graph 404 is caused by the motion of the armature as it changes states from the off position to the on position. Then, once the maximum desired current level is reached, the digital logic line trips, as shown in graph 406, and a reduced voltage is applied, as shown in graph 402, to hold the armature in the on position. The fact that the logic line tripped and the amount of time elapsed from the beginning of actuation to the time that the logic line tripped may be used to diagnose the I/P converter as properly functioning. For example, using a 650 ohm coil, a 7 V drive rail, and a 5 mA maximum current, approximately 8 ms will elapse from the beginning of actuation until the 5 mA maximum current is reached for a properly functioning I/P converter.

Thus, for an I/P converter having these parameters, the diagnostic circuit may determine, based on a digital logic line tripping 8 ms from the beginning of actuation, that the I/P converter is functioning properly. Of course, for a properly functioning I/P converter having different parameters, the amount of time that will elapse from the beginning of actuation until the maximum desired current level is reached may be different. In any case, for an I/P converter with known parameters, the diagnostic circuit may determine that the I/P converter is functioning properly based on an amount of time elapsed from the beginning of actuation when the digital logic line trips.

Figure 5:
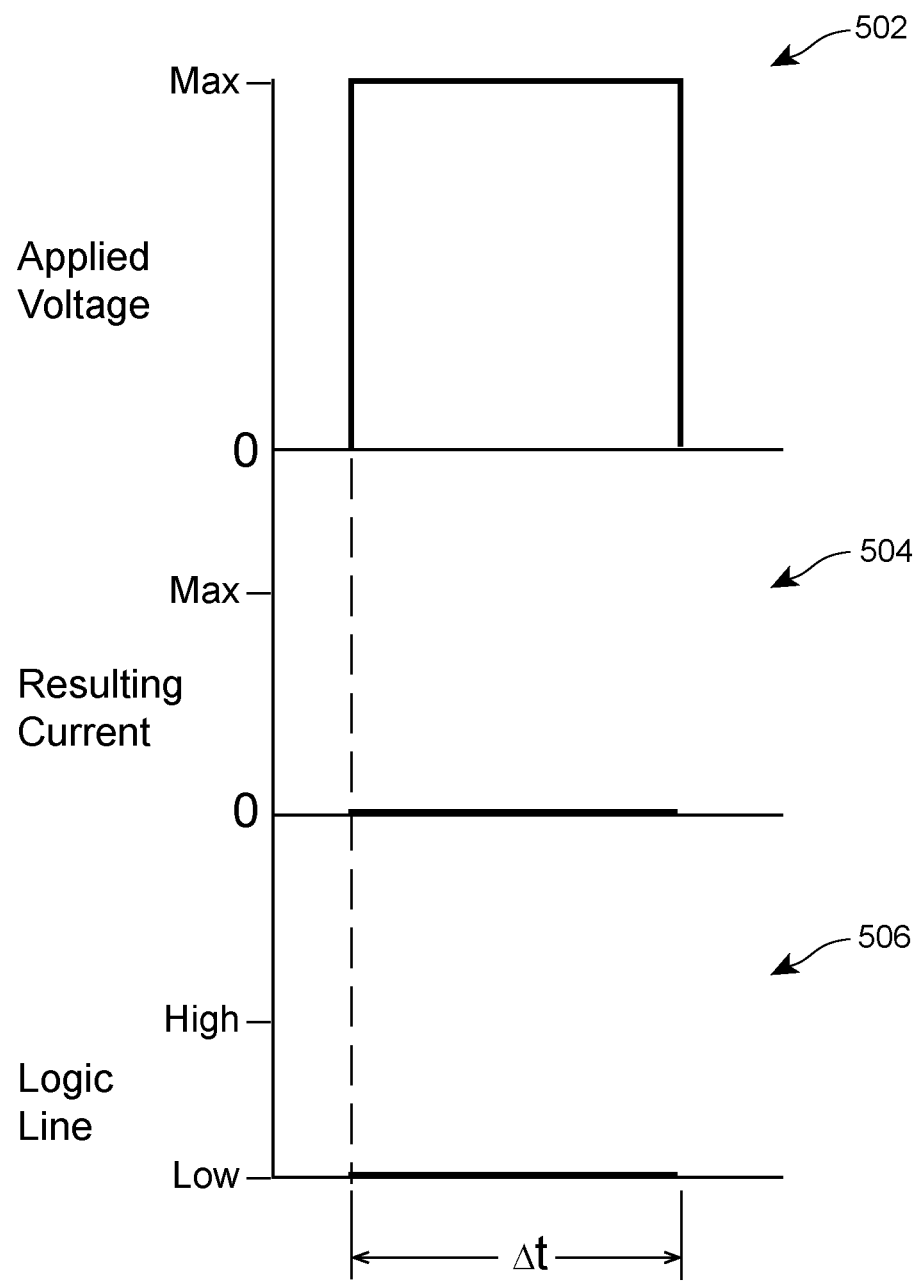
FIG. 5 includes several example graphs illustrating applied voltage over time, resulting current over time and logic line trips over time for an example electro-pneumatic converter with an open circuit in the coil or drive circuitry.

FIG. 5 illustrates example graphs 502, 504, and 506 illustrating applied voltage over time (502), resulting current over time (504) and logic line trips over time (506) for an example I/P converter with an open circuit in the coil or drive circuitry. For instance, graph 502 illustrates that for an example I/P converter with an open circuit in the coil or drive circuitry, a fixed voltage is applied indefinitely because, as shown in graph 504, the desired maximum current level is never reached. That is, no current is ever generated due to the open circuit in the coil or drive circuitry. Consequently, as shown in graph 506, the logic line never trips. Accordingly, the diagnostic circuit may diagnose the I/P converter as having an open circuit in the coil or drive circuitry based on the fact that the logic line never tripped after the application of the fixed voltage.

Figure 6:
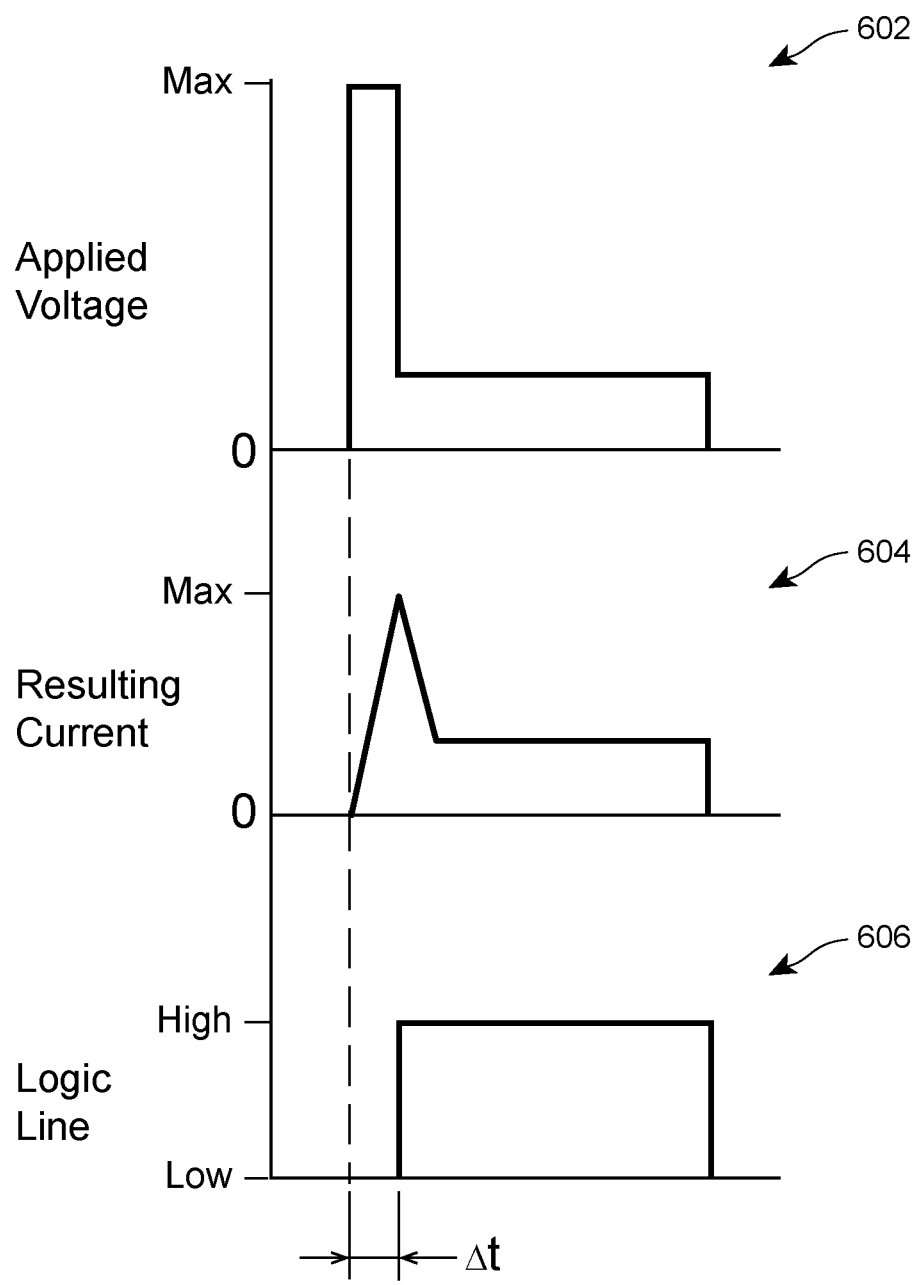
FIG. 6 includes several example graphs illustrating applied voltage over time, resulting current over time and logic line trips over time for an example electro-pneumatic converter with a short circuit in the coil or drive circuitry.

FIG. 6 illustrates example graphs 602, 604, and 606 illustrating applied voltage over time (602), resulting current over time (604) and logic line trips over time (606) for an example I/P converter with a short circuit in the coil or drive circuitry. Since the resistance of the coil is eliminated, after the fixed voltage is initially applied, as shown in graph 602, the current rises very quickly to reach the desired maximum current, as shown in graph 604. Then, once the maximum desired current level is reached, the digital logic line trips, as shown in graph 606, and a reduced voltage is applied, as shown in graph 602. The fact that the logic line tripped and the amount of time elapsed from the beginning of actuation to the time that the logic line tripped may be used to diagnose the I/P converter as short-circuited. For example, using a shorted coil, a 7 V drive rail, and a 5 mA maximum current, approximately 0.1 ms will elapse from the beginning of actuation until the 5 mA maximum current is reached.

Thus, for an I/P converter having these parameters, the diagnostic circuit may diagnose the I/P converter as short circuited based on the digital logic line tripping with only 0.1 ms elapsed from the beginning of actuation. Of course, for a short circuited I/P converter having different parameters, the amount of time that will elapse from the beginning of actuation until the maximum desired current level is reached may be different. In any case, for an I/P converter with known parameters, the diagnostic circuit may determine that the I/P converter is short-circuited based on the amount of time elapsed from the initial application of voltage when the digital logic line trips. This amount of time will generally be much shorter than the amount of time after the beginning of actuation when the digital logic line will trip that will indicate that the I/P converter is properly functioning, because the lack of resistance causes the current to reach the desired maximum current much more quickly.

Figure 7:
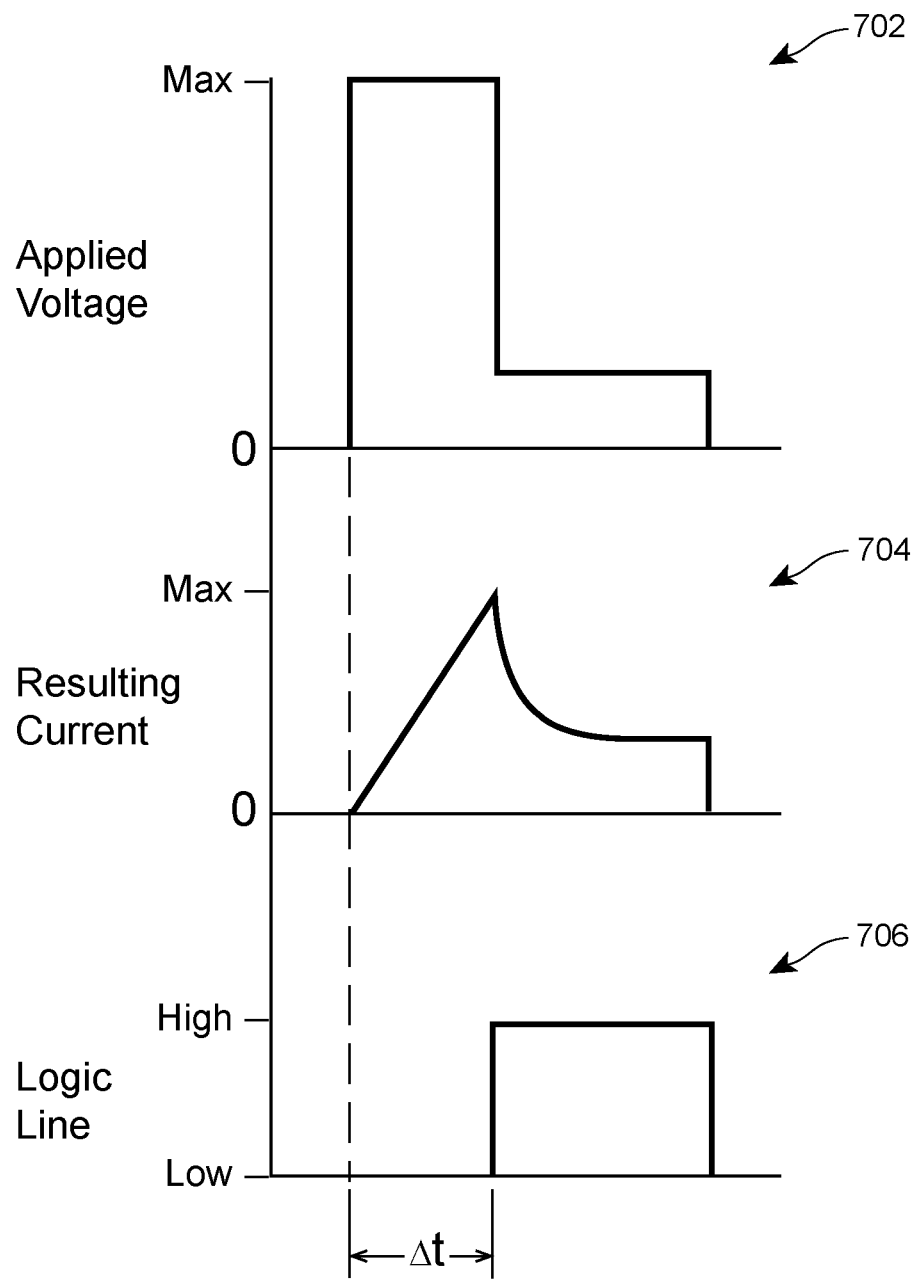
FIG. 7 includes several example graphs illustrating applied voltage over time, resulting current over time and logic line trips over time for an example electro-pneumatic converter associated with an armature that was either already in the latched position at the time of actuation, or never moved from the unlatched position to the latched position.

FIG. 7 illustrates example graphs 702, 704, and 706 illustrating applied voltage over time (702), resulting current over time (704) and logic line trips over time (706) for an example I/P converter associated with an armature that was either already in the latched position (or on position) at the time of actuation, or never moved from the unlatched position (or off position) to the latched position. After the fixed voltage is applied, as shown in graph 702, the resulting current will reach the maximum desired current level, as shown in graph 704, and the logic line will trip, as shown in graph 706, more quickly than for a properly functioning I/P converter because there is no dip in current caused by the movement of the armature. The diagnostic circuit may diagnose the I/P converter as either already being in the latched position or not moving from the unlatched position to the latched position based on the amount of time elapsed from the beginning of actuation when the digital logic line trips. For example, using a 650 ohm coil, a 7 V drive rail, and a 5 mA maximum current, approximately 4 ms will elapse from the beginning of actuation until the 5 mA maximum current is reached in an I/P converter with an armature already in the latched position or an armature that failed to move from the unlatched position to the latched position.

Thus, for an I/P converter having these parameters, the diagnostic circuit may determine that the armature was either already in the latched position at the time of actuation or never moved from the unlatched position to the latched position even after the fixed voltage was applied based on the digital logic line tripping 4 ms from the beginning of actuation. Of course, for an I/P converter having different parameters with an armature that is either already in latched position or that never moved from the unlatched position to the latched position, the amount of time that will elapse from the beginning of actuation until the maximum desired current level is reached may be different. In any case, for an I/P converter with known parameters, there will be an amount of time after the beginning of actuation when the digital logic line will trip that will indicate that the I/P converter was already in the latched position when the fixed voltage was applied or never moved from the unlatched position to the latched position when the fixed voltage was applied, and this amount of time will generally be somewhat shorter than the amount of time after the beginning of actuation when the digital logic line will trip that will indicate that the I/P converter is properly functioning, due to the lack of current dip compared to a properly functioning I/P converter (because the armature never actually moves).

Figure 8:
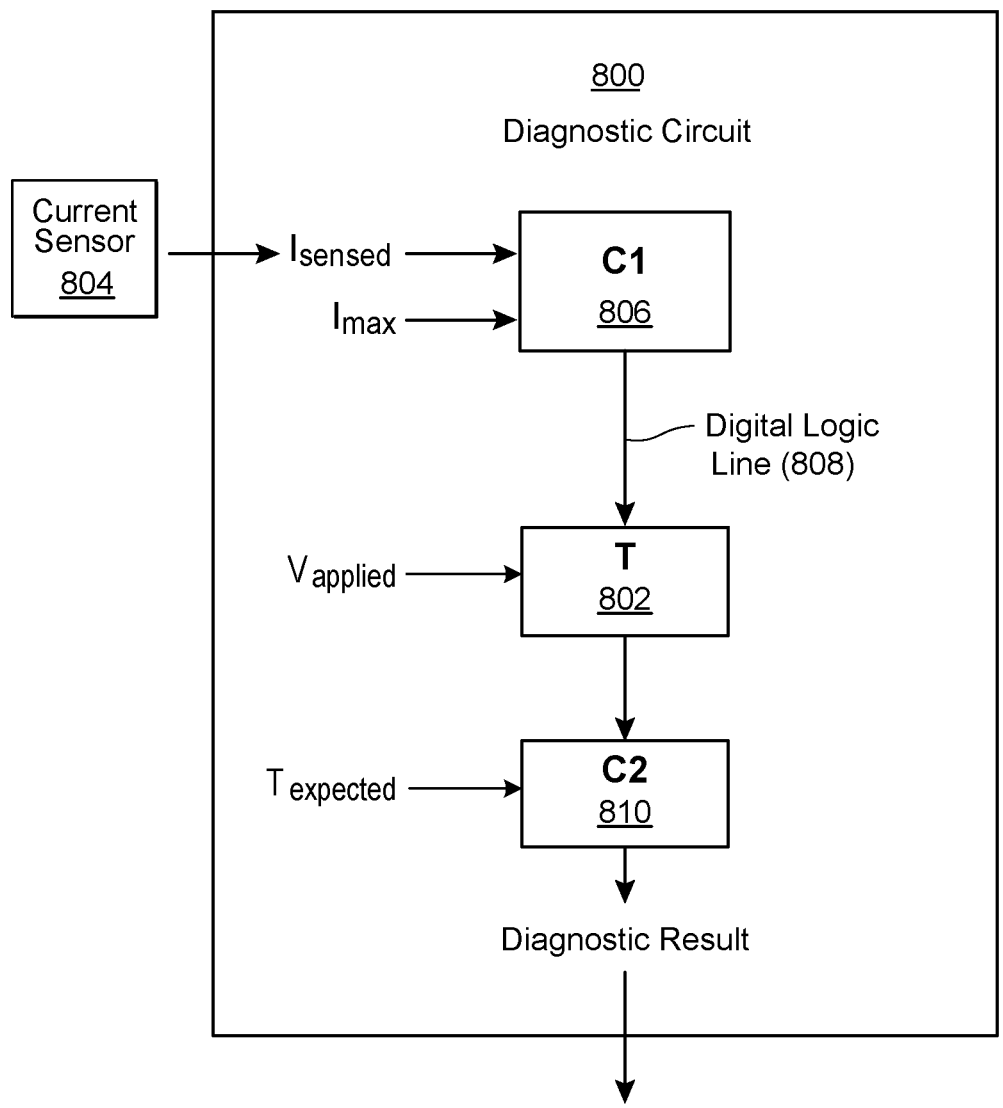
FIG. 8 illustrates an example diagnostic circuit for diagnosing possible failures of the example electro-pneumatic converter of FIG. 1.

FIG. 8 illustrates an example logic circuit 800 for diagnosing possible failures of the example electro-pneumatic converter of FIG. 1. In some examples, the logic shown in the circuit 800 may be implemented by a processor of the controller 120, e.g., as a control module, while in other examples, the logic shown in the circuit 800 may be implemented by hardware circuit elements of the I/P converter 100.

A timer (T) 802 of the logic circuit 800 may determine that a fixed voltage ($V_{applied}$) has been applied to the I/P coil 112 at a first time. For instance, in some examples, when the logic circuit 800 is implemented by a processor of the controller 120, the logic circuit may determine that the fixed voltage has been applied to the I/P coil 112 at the first time based on the controller 120 causing the fixed voltage to be applied to the I/P coil 112 (e.g., via the drive circuitry) at the first time. In other examples, when the logic circuit 800 is implemented by hardware circuit elements of the I/P converter 100, the timer 802 may determine that the fixed voltage has been applied to the I/P coil at the first time based on receiving an indication from a voltage sensor (not shown) associated with the I/P coil 112 indicating that a fixed voltage has been applied to the I/P coil 112.

The logic circuit 800 may receive an indication of a sensed current level ($I_{sensed}$) of the I/P coil 112 from a current sensor 804 associated with the I/P coil 112. A first comparator (C1) 806 of the logic circuit 800 may compare the sensed current to a desired maximum current level ($I_{max}$) for the I/P coil 112 and may cause a digital logic line 808 to trip based on the sensed current reaching the desired maximum current level.

The timer 802 may determine a time elapsed ($T_{elapsed}$) from the first time (when the fixed voltage was applied to the I/P coil 112) to a second time associated with the tripping of the digital logic line 808.

A second comparator (C2) 810 of the logic circuit 800 may receive the elapsed time from the timer 802 and may compare the elapsed time to an expected elapsed time from the application of a fixed voltage to the I/P coil 112 reaching the desired maximum current level for a properly functioning I/P converter 100 to determine whether the I/P coil 112 and/or drive circuitry 121 are properly functioning. Furthermore, if the I/P coil 112 and/or drive circuitry 121 are not properly functioning, the second comparator 810 may diagnose a possible reason for the failure (diagnostic result).

For instance, if the elapsed time is approximately equal to the expected elapsed time, the second comparator 810 may determine that the I/P converter 100 is properly functioning. If the elapsed time is greater than the expected elapsed time (or if the digital logic line 808 never trips), the second comparator 810 may determine that there is an open circuit in one or more of the I/P coil 112 or drive circuitry 121. If the elapsed time is less than the expected elapsed time by greater than a threshold amount of time, the second comparator 810 may determine that there is a short circuit in one or more of the I/P coil 112 or the drive circuitry 121. Furthermore, if the elapsed time is less than the expected elapsed time by less than the threshold amount of time, the second comparator 810 may determine that the armature of the I/P converter 100 was either already in the on position when the fixed voltage was applied or never moved from the off position to the on position.

In examples in which the logic circuit 800 is not implemented as part of the controller 120, the logic circuit 800 may transmit the diagnostic result to the controller 120. In examples in which the logic circuit 800 is implemented as part of the controller 120, the controller may receive the diagnostic result directly from the logic circuit 800. The controller 120 may in turn take a control action changing the operation of the process control system based on the diagnostic result. For example, the controller 120 may change the control strategy to mitigate the fact that the I/P converter 100 is not functioning properly. For instance, the controller 120 may cause the process control system to switch to a redundant field device based on the fact that the I/P converter 100 of a particular field device is not functioning properly. As another example, the controller 120 may generate an alarm based on the diagnostic result, or otherwise communicate the diagnostic result to an operator of the process control system.

Figure 9:
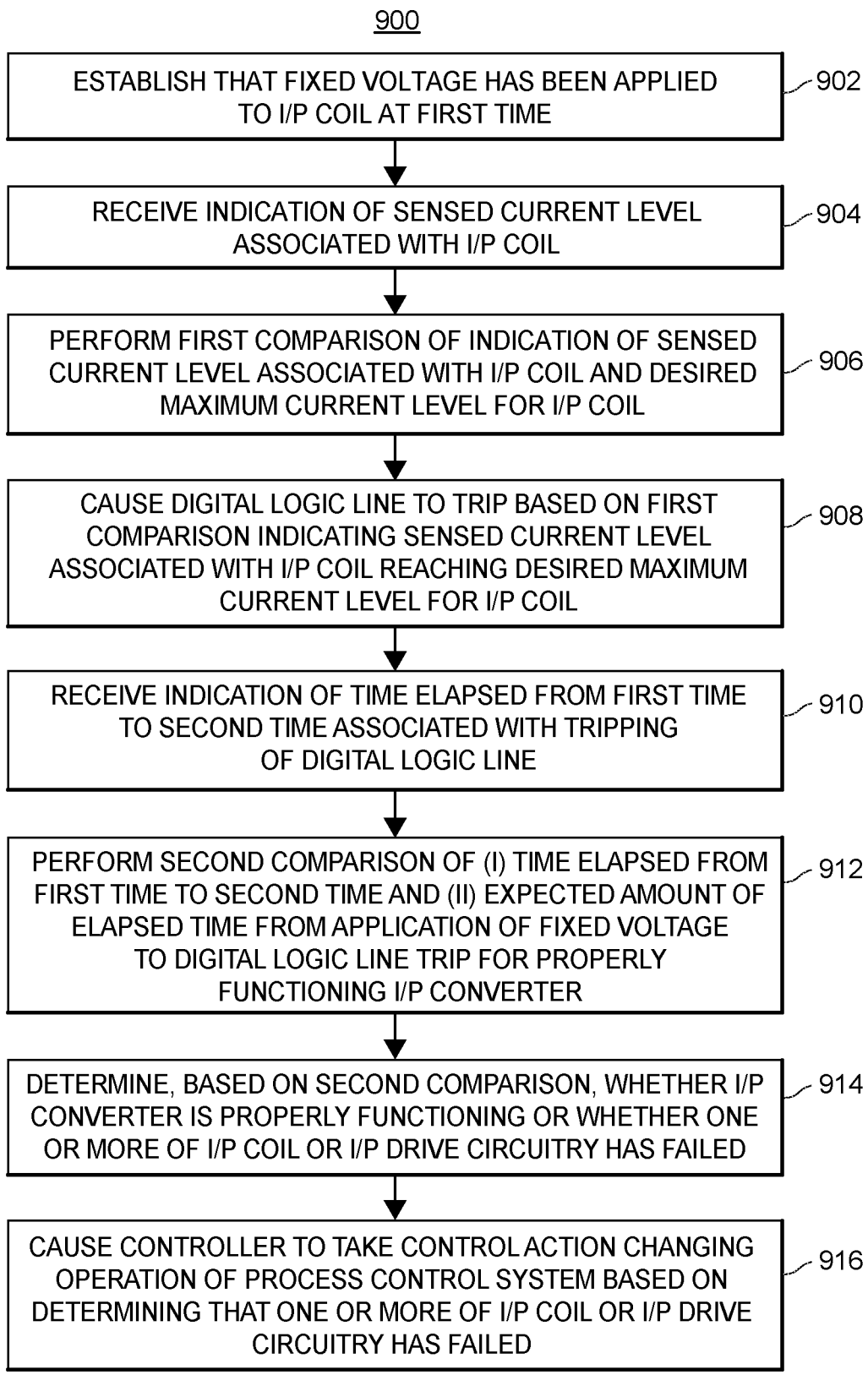
FIG. 9 is a flowchart representative of an example method that may be implemented by a controller to diagnose possible failures of the example electro-pneumatic converter of FIG. 1.

FIG. 9 is a flowchart 900 representative of an example method that may be implemented by a controller 120 to diagnose possible failures of the example electro-pneumatic converter 100 of FIG. 1.

At block 902, the controller 120 may establish that a fixed voltage has been applied to an I/P coil 112 of the I/P converter 100 at a first time (e.g., based on the controller 120 applying the fixed voltage to the I/P coil 112 via the drive circuitry 121, and/or based on receiving an indication, from a voltage sensor associated with the I/P coil 112, that a fixed voltage has been applied to the I/P coil 112).

At block 904, the controller 120 may receive an indication of a sensed current level associated with the I/P coil 112, e.g., via a current sensor associated with the I/P coil 112. At block 906, the controller 120 may perform a first comparison, comparing the sensed current level to a desired maximum current level for the I/P coil 112. At block 908, the controller 120 may cause a digital logic line to trip based on the comparison, when the sensed current level reaches the desired maximum current level for the I/P coil 112. At block 910, the controller 120 may receive an indication of a time elapsed from the first time to a second time associated with the digital logic line trip. At block 912, the controller 120 may perform a second comparison, comparing the elapsed time from the first time to the second time to an expected elapsed time at which a digital logic line will trip after the application of a fixed voltage in a properly functioning I/P converter 100.

At block 914, the controller 120 may determine whether the I/P converter 100 is properly functioning or whether one or more of the I/P coil 112 or drive circuitry 120 has failed based on the second comparison. For example, using a 650 ohm coil, a 7 V drive rail, and a 5 mA maximum current, approximately 8 ms will elapse from the beginning of actuation until the 5 mA maximum current is reached for a properly functioning I/P converter. In this example, the controller 120 may compare the elapsed time from the first time to the second time to an expected elapsed time of 8 ms. In some examples, the controller 120 may determine that the I/P coil and drive circuitry are properly functioning based on the elapsed time from the first time to the second time being approximately equal to the expected elapsed time. That is, in the example described above, if the logic line trip occurs approximately 8 ms after the application of the fixed voltage to the I/P coil, the controller 120 may determine that the I/P coil and drive circuitry are properly functioning.

Furthermore, in some examples, the controller 120 may determine that the I/P coil or the drive circuitry have failed due to an open circuit in the I/P coil or drive circuitry based on the logic line trip not occurring after the expected amount of elapsed time from the application of the fixed voltage to the I/P coil. That is, when there is an open circuit in the coil or in the drive circuitry, the logic line will never be tripped because the current is never generated. Accordingly, if there is no digital logic line trip before the fixed voltage to the I/P coil is removed, the may determine that the I/P coil or drive circuitry have failed due to an open circuit in the I/P coil or drive circuitry.

Moreover, in some examples, the controller 120 may determine, based on the elapsed time from the first time to the second time being smaller than the expected amount of elapsed time by greater than a threshold amount of time, that one or more of the I/P coil 112 or the drive circuitry 121 have failed due to a short circuit in one or more of the I/P coil 112 or drive circuitry 121. For instance, the threshold amount of time may be a certain percentage or fraction of the expected elapsed time (e.g., half of the expected elapsed time, three-quarters of the expected elapsed time, etc.). For example, using a shorted coil, a 7 V drive rail, and a 5 mA maximum current, when the coil is short-circuited, the current will rise very quickly because the resistance of the coil is eliminated. Consequently, in this example, when the coil is short-circuited, only approximately 0.1 ms will elapse from the beginning of actuation until the 5 mA current level is reached—much less than the 8 ms expected elapsed time for a properly functioning I/P converter 100.

Additionally, in some examples, the controller 120 may determine, based elapsed time from the first time to the second time being smaller than the expected amount of elapsed time by less than a threshold amount of time, that one or more of the I/P coil 112 or the drive circuitry 121 have failed due to the armature already being in the on-position or due to the armature failing to move from the off-position to the on-position. For instance, as discussed above, the threshold amount of time may be a certain percentage or fraction of the expected elapsed time (e.g., half of the expected elapsed time, three-quarters of the expected elapsed time, etc.). That is, in the example described above, using a 650 ohm coil, a 7 V drive rail, and a 5 mA maximum current, when the armature is either already pulled in at the time of actuation or fails to pull in, the time to reach the 5 mA current level is reduced, as there is no dip in the current (because the armature does not move). Consequently, in this example, when the armature does not move, approximately 4 ms will elapse from the beginning of actuation until the 5 mA current level is reached, which is less than the expected elapsed time for a properly functioning I/P converter 100 (8 ms) by about half of the expected elapsed time.

At block 916, the controller 120 may take a control action changing the operation of the process control system in which the I/P converter 100 operates based on determining that one or more of the I/P coil 112 and/or drive circuitry 121 have failed. For example, the controller 120 may change the control strategy to mitigate the fact that the I/P converter 100 is not functioning properly. For instance, the controller 120 may cause the process control system to switch to a redundant field device based on the fact that the I/P converter 100 of a particular field device is not functioning properly.

Furthermore, in some examples, the method 800 may include the controller 120 generating an alert based on determining that one or more of the I/P coil or the drive circuitry has failed.

Aspects

Embodiments of the techniques described in the present disclosure may include any number of the following aspects, either alone or combination:

1. A method for diagnosing failures in a digital solenoid I/P converter in a process control system, wherein the digital solenoid I/P converter includes an I/P coil and drive circuitry, and wherein the digital solenoid I/P converter, when actuated, causes an armature to move from an off-position to an on-position, the method comprising: establishing that a fixed voltage has been applied to the I/P coil at a first time; receiving, from a current sensor, an indication of a current level associated with the I/P coil; performing a first comparison of the indication of the current level associated with the I/P coil and a desired maximum current level; causing, based on the comparison, a digital logic line to trip when the current level associated with the I/P coil reaches the desired maximum current level; receiving, from a timer, an indication of an amount of time that has elapsed from the first time to a second time, the second time being a time associated with the digital logic line trip; performing a second comparison of (i) the amount of time elapsed from the first time to the second time and (ii) an expected amount of elapsed time from the application of the fixed voltage to the I/P coil after which the digital logic line will trip for a properly functioning I/P coil and drive circuitry; and determining, based on the second comparison, whether the I/P coil and drive circuitry are properly functioning or whether one or more of the I/P coil or the drive circuitry has failed.

2. The method of aspect 1, further comprising: causing a controller to take a control action changing the operation of the process control system based on determining that one or more of the I/P coil or the drive circuitry has failed.

3. The method of any of aspects 1 or 2, wherein determining whether the I/P coil and drive circuitry are properly functioning or whether one or more of the I/P coil or the drive circuitry has failed further comprises: determining, based on the amount of time elapsed from the first time to the second time being substantially equal to the expected amount of elapsed time, that the I/P coil and drive circuitry are properly functioning.

4. The method of any of aspects 1-3, wherein determining whether the I/P coil and drive circuitry are properly functioning or whether one or more of the I/P coil or the drive circuitry has failed further comprises: determining, based on the digital logic line not tripping after the expected amount of elapsed time from the first time, that the I/P coil or the drive circuitry have failed due to an open circuit in the I/P coil or drive circuitry.

5. The method of any of aspects 1-4, wherein determining whether the I/P coil and drive circuitry are properly functioning or whether one or more of the I/P coil or the drive circuitry has failed further comprises: determining, based the amount of time elapsed from the first time to the second time being smaller than the expected amount of elapsed time by greater than a threshold amount of time, that one or more of the I/P coil or the drive circuitry have failed due to a short circuit in one or more of the I/P coil or drive circuitry.

6. The method of any of aspects 1-5, wherein determining whether the I/P coil and drive circuitry are properly functioning or whether one or more of the I/P coil or the drive circuitry has failed further comprises: determining, based the amount of time elapsed from the first time to the second time being smaller than the expected amount of elapsed time by less than a threshold amount of time, that one or more of the I/P coil or the drive circuitry have failed due to the armature already being in the on-position or due to the armature failing to move from the off-position to the on-position.

7. The method of any of aspects 1-6, further comprising: generating an alert based on determining that one or more of the I/P coil or the drive circuitry has failed.

8. The method of any of aspects 1-7, further comprising: removing the fixed voltage applied to the I/P coil after a threshold period of time has elapsed from the time of the application of the fixed voltage to the I/P coil.

9. A system for diagnosing failures in a digital solenoid I/P converter in a process control system, the system comprising: a digital solenoid I/P converter, including an I/P coil and drive circuitry, the digital solenoid I/P converter being configured to cause an armature to move from an off-position to an on-position when actuated; a controller configured to cause a fixed voltage to be applied to the I/P coil at a first time, a current sensor configured to sense an amount of current associated with the I/P coil; a timer configured to determine an amount of time elapsed from the first time; and the diagnostic circuit configured to: perform a first comparison of the sensed amount of current associated with the I/P coil and a maximum desired current level; cause, based on the first comparison, a digital logic line to trip when the sensed amount of current associated with the I/P coil reaches the maximum desired current level; receive, from the timer, an indication of an amount of time that has elapsed from the first time to a second time associated with the tripping of the digital logic line; perform a second comparison of the (i) the amount of time elapsed from first time to the second time to (ii) an expected amount of elapsed time from the application of the fixed voltage to the I/P coil after which a digital logic line trip will occur for a properly functioning I/P coil and drive circuitry; and determine, based on the second comparison, whether the I/P coil and drive circuitry are properly functioning or whether one or more of the I/P coil or the drive circuitry has failed.

10. The system of aspect 9, wherein the controller is further configured to take a control action changing the operation of the process control system based on a diagnostic circuit determining that one or more of the I/P coil or the drive circuitry has failed.

11. The system of any of aspects 9 or 10, wherein the diagnostic circuit is configured to determine that the I/P coil and drive circuitry are properly functioning based on the amount of time elapsed from the first time to the second time being substantially equal to the expected amount of elapsed time from the application of the fixed voltage to the I/P coil.

12. The system of any of aspects 9-11, wherein the diagnostic circuit is configured to determine that the I/P coil or the drive circuitry have failed due to an open circuit in the I/P coil or drive circuitry based on the logic line trip not occurring after the expected amount of elapsed time from the application of the fixed voltage to the I/P coil.

13. The system of any of aspects 9-12, wherein the diagnostic circuit is configured to determine that one or more of the I/P coil or the drive circuitry have failed due to a short circuit in one or more of the I/P coil or drive circuitry based on the amount of time elapsed from the first time to the second time being smaller than the expected amount of elapsed time by greater than a threshold amount of time.

14. The system of any of aspects 9-13, wherein the diagnostic circuit is configured to determine that one or more of the I/P coil or the drive circuitry have failed due to the armature already being in the on-position or due to the armature failing to move from the off-position to the on-position based on the amount of time elapsed from the first time to the second time being smaller than the expected amount of elapsed time by less than a threshold amount of time.

15. The system of any of aspects 9-14, wherein the controller is further configured to generate an alert based on the diagnostic circuit determining that one or more of the I/P coil or the drive circuitry has failed.

16. The system of any of aspects 9-15, wherein the controller is further configured to remove the fixed voltage applied to the I/P coil after a threshold period of time has elapsed from the time of the application of the fixed voltage to the I/P coil.

What is claimed is:

1. A method for diagnosing failures in a digital solenoid I/P converter of a field device in a process control system, wherein the digital solenoid I/P converter includes an I/P coil and drive circuitry, and wherein the digital solenoid I/P converter, when actuated, causes an armature to move from an off-position to an on-position, the method comprising:
    establishing that a fixed voltage has been applied to the I/P coil at a first time;
    receiving, from a current sensor, an indication of a current level associated with the I/P coil;
    performing a first comparison of the indication of the current level associated with the I/P coil and a desired maximum current level;
    causing, based on the comparison, a digital logic line to trip when the current level associated with the I/P coil reaches the desired maximum current level;
    receiving, from a timer, an indication of an amount of time that has elapsed from the first time to a second time, the second time being a time associated with the digital logic line trip;
    performing a second comparison of (i) the amount of time elapsed from the first time to the second time and (ii) an expected amount of elapsed time from the application of the fixed voltage to the I/P coil after which the digital logic line will trip for a properly functioning I/P coil and drive circuitry;
    determining, based on the second comparison, whether the I/P coil and drive circuitry are properly functioning or whether one or more of the I/P coil or the drive circuitry has failed; and
    causing a controller to take a control action changing the operation of the process control system based on determining that one or more of the I/P coil or the drive circuitry has failed, wherein the control action includes switching from using the field device in the process control system to using a second, redundant field device in the process control system.

2. The method of claim 1, wherein determining whether the I/P coil and drive circuitry are properly functioning or whether one or more of the I/P coil or the drive circuitry has failed further comprises:
determining, based on the amount of time elapsed from the first time to the second time being substantially equal to the expected amount of elapsed time, that the I/P coil and drive circuitry are properly functioning.

3. The method of claim 1, wherein determining whether the I/P coil and drive circuitry are properly functioning or whether one or more of the I/P coil or the drive circuitry has failed further comprises:
determining, based on the digital logic line not tripping after the expected amount of elapsed time from the first time, that the I/P coil or the drive circuitry have failed due to an open circuit in the I/P coil or drive circuitry.

4. The method of claim 1, wherein determining whether the I/P coil and drive circuitry are properly functioning or whether one or more of the I/P coil or the drive circuitry has failed further comprises:
determining, based the amount of time elapsed from the first time to the second time being smaller than the expected amount of elapsed time by greater than a threshold amount of time, that one or more of the I/P coil or the drive circuitry have failed due to a short circuit in one or more of the I/P coil or drive circuitry.

5. The method of claim 1, wherein determining whether the I/P coil and drive circuitry are properly functioning or whether one or more of the I/P coil or the drive circuitry has failed further comprises:
determining, based the amount of time elapsed from the first time to the second time being smaller than the expected amount of elapsed time by less than a threshold amount of time, that one or more of the I/P coil or the drive circuitry have failed due to the armature already being in the on-position or due to the armature failing to move from the off-position to the on-position.

6. The method of claim 1, further comprising:
generating an alert based on determining that one or more of the I/P coil or the drive circuitry has failed.

7. The method of claim 1, further comprising:
removing the fixed voltage applied to the I/P coil after a threshold period of time has elapsed from the time of the application of the fixed voltage to the I/P coil.

8. A system for diagnosing failures in a digital solenoid I/P converter in a process control system, the system comprising:
a digital solenoid I/P converter of a field device of the process control system, including an I/P coil and drive circuitry, the digital solenoid I/P converter being configured to cause an armature to move from an off-position to an on-position when actuated;
a controller configured to cause a fixed voltage to be applied to the I/P coil at a first time;
a current sensor configured to sense an amount of current associated with the I/P coil;
a timer configured to determine an amount of time elapsed from the first time; and
a diagnostic circuit configured to:
perform a first comparison of the sensed amount of current associated with the I/P coil and a maximum desired current level;
cause, based on the first comparison, a digital logic line to trip when the sensed amount of current associated with the I/P coil reaches the maximum desired current level;
receive, from the timer, an indication of an amount of time that has elapsed from the first time to a second time associated with the tripping of the digital logic line;
perform a second comparison of the (i) the amount of time elapsed from first time to the second time to (ii) an expected amount of elapsed time from the application of the fixed voltage to the I/P coil after which a digital logic line trip will occur for a properly functioning I/P coil and drive circuitry;
determine, based on the second comparison, whether the I/P coil and drive circuitry are properly functioning or whether one or more of the I/P coil or the drive circuitry has failed; and
cause the controller to take a control action changing the operation of the process control system based on determining that one or more of the I/P coil or the drive circuitry has failed, wherein the control action includes switching from using the field device in the process control system to using a second, redundant field device in the process control system.

9. The system of claim 8, wherein the diagnostic circuit is configured to determine that the I/P coil and drive circuitry are properly functioning based on the amount of time elapsed from the first time to the second time being substantially equal to the expected amount of elapsed time from the application of the fixed voltage to the I/P coil.

10. The system of claim 8, wherein the diagnostic circuit is configured to determine that the I/P coil or the drive circuitry have failed due to an open circuit in the I/P coil or drive circuitry based on the logic line trip not occurring after the expected amount of elapsed time from the application of the fixed voltage to the I/P coil.

11. The system of claim 8, wherein the diagnostic circuit is configured to determine that one or more of the I/P coil or the drive circuitry have failed due to a short circuit in one or more of the I/P coil or drive circuitry based on the amount of time elapsed from the first time to the second time being smaller than the expected amount of elapsed time by greater than a threshold amount of time.

12. The system of claim 8, wherein the diagnostic circuit is configured to determine that one or more of the I/P coil or the drive circuitry have failed due to the armature already being in the on-position or due to the armature failing to move from the off-position to the on-position based on the amount of time elapsed from the first time to the second time being smaller than the expected amount of elapsed time by less than a threshold amount of time.

13. The system of claim 8, wherein the controller is further configured to generate an alert based on the diagnostic circuit determining that one or more of the I/P coil or the drive circuitry has failed.

14. The system of claim 8, wherein the controller is further configured to remove the fixed voltage applied to the I/P coil after a threshold period of time has elapsed from the time of the application of the fixed voltage to the I/P coil.

* * * * *

UNITED STATES PATENT AND TRADEMARK OFFICE
CERTIFICATE OF CORRECTION

PATENT NO. : 11,269,017 B2
APPLICATION NO. : 16/778814
DATED : March 8, 2022
INVENTOR(S) : Michael R. Fontaine et al.

It is certified that error appears in the above-identified patent and that said Letters Patent is hereby corrected as shown below:

In the Specification

At Column 13, Line 53, "based" should be -- based on --.

At Column 14, Line 55, "aspects 1 or 2," should be -- aspect 1 or 2, --.

At Column 15, Line 63, "failed;" should be -- failed. --.

At Column 15, Line 64, "aspects 9 or 10," should be -- aspect 9 or 10, --.

In the Claims

At Column 17, Line 26, in Claim 4, "based" should be -- based on --.

At Column 17, Line 36, in Claim 5, "based" should be -- based on --.

Signed and Sealed this
Ninth Day of May, 2023

Katherine Kelly Vidal
*Director of the United States Patent and Trademark Office*